United States Patent
Taniguchi

(10) Patent No.: US 11,070,193 B2
(45) Date of Patent: Jul. 20, 2021

(54) ELASTIC WAVE DEVICE, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 4 days.

(21) Appl. No.: 16/168,860

(22) Filed: Oct. 24, 2018

(65) Prior Publication Data

US 2019/0165764 A1    May 30, 2019

(30) Foreign Application Priority Data

Nov. 24, 2017 (JP) .............................. JP2017-225445
Sep. 27, 2018 (JP) .............................. JP2018-182323

(51) Int. Cl.
*H03H 9/54* (2006.01)
*H01L 41/083* (2006.01)
*H01L 41/08* (2006.01)
*H03H 9/145* (2006.01)
*H03H 9/02* (2006.01)

(52) U.S. Cl.
CPC ............ *H03H 9/54* (2013.01); *H01L 41/083* (2013.01); *H01L 41/0805* (2013.01); *H03H 9/02574* (2013.01); *H03H 9/14541* (2013.01)

(58) Field of Classification Search
CPC .. H03H 9/54; H03H 9/02574; H03H 9/14541; H01L 41/0805; H01L 41/083
See application file for complete search history.

(56) References Cited

U.S. PATENT DOCUMENTS

2009/0121584 A1    5/2009   Nishimura et al.
2009/0174284 A1*   7/2009   Mimura ............. H03H 9/14541
                                                    310/313 A (Continued)

FOREIGN PATENT DOCUMENTS

JP    2008-079275 A    4/2008
JP    2012-175315 A    9/2012

(Continued)

OTHER PUBLICATIONS

Official Communication issued in corresponding Japanese Patent Application No. 2018-182323, dated Feb. 2, 2021.

(Continued)

*Primary Examiner* — Samuel S Outten
(74) *Attorney, Agent, or Firm* — Keating & Bennett, LLP

(57) ABSTRACT

An elastic wave device includes a piezoelectric material layer, an IDT electrode on the piezoelectric material layer, and a dielectric film covering the IDT electrode. The IDT electrode includes a first electrode layer and a second electrode layer laminated on the first electrode layer. Each of wavelength normalized film thicknesses of the first and second electrode layers is equal to or greater than about 1.25%, and is normalized using a wave length defined by the electrode finger pitch of the IDT electrode. The second electrode layer has a density lower than that of the first electrode layer. The side of the second electrode layer is inclined with respect to the thickness direction of the IDT electrode.

20 Claims, 9 Drawing Sheets

(56) References Cited

U.S. PATENT DOCUMENTS

| | | | | |
|---|---|---|---|---|
| 2012/0133246 A1* | 5/2012 | Yaoi | ............... | H01L 41/047 |
| | | | | 310/313 C |
| 2012/0187799 A1* | 7/2012 | Nakahashi | ......... | H03H 9/14544 |
| | | | | 310/313 A |
| 2013/0069481 A1* | 3/2013 | Kimura | ............. | H01L 41/107 |
| | | | | 310/313 R |
| 2013/0335170 A1* | 12/2013 | Ikuta | ............. | H03H 9/14538 |
| | | | | 333/193 |
| 2014/0232239 A1* | 8/2014 | Iwasaki | ............ | H03H 9/02834 |
| | | | | 310/313 C |
| 2017/0025596 A1* | 1/2017 | Qiu | ............... | H03H 9/568 |
| 2018/0026605 A1 | 1/2018 | Ito et al. | | |
| 2018/0109241 A1* | 4/2018 | Inoue | ............ | H03H 9/14541 |
| 2018/0131348 A1* | 5/2018 | Takahashi | ......... | H03H 9/02992 |
| 2018/0159507 A1* | 6/2018 | Goto | ............... | H03H 9/25 |
| 2019/0089324 A1* | 3/2019 | Challa | ............ | H03H 9/6436 |
| 2020/0186124 A1* | 6/2020 | Kasamatsu | ............ | H03H 9/25 |

FOREIGN PATENT DOCUMENTS

| | | |
|---|---|---|
| JP | 2014-158138 A | 8/2014 |
| WO | 2007/034832 A1 | 3/2007 |
| WO | 2011/145449 A1 | 11/2011 |
| WO | 2012/102131 A1 | 8/2012 |
| WO | 2016/121818 A1 | 8/2016 |
| WO | 2017/111170 A1 | 6/2017 |

OTHER PUBLICATIONS

Official Communication issued in corresponding Japanese Patent Application No. 2018-182323, dated May 11, 2021.

* cited by examiner

ELASTIC WAVE DEVICE, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-225445 filed on Nov. 24, 2017 and Japanese Patent Application No. 2018-182323 filed on Sep. 27, 2018. The entire contents of each application are hereby incorporated herein by reference.

BACKGROUND OF THE INVENTION

1. Field of the Invention

The present invention relates to an elastic wave device, a radio-frequency front-end circuit, and a communication device.

2. Description of the Related Art

In the related art, elastic wave devices are widely used, for example, in filters in cellular phones. An exemplary elastic wave device is disclosed in Japanese Unexamined Patent Application Publication No. 2012-175315. In this elastic wave device, an interdigital transducer (IDT) electrode including a laminated metal film in which multiple metal layers are laminated is disposed on a piezoelectric substrate. The sides of the electrode fingers of the IDT electrode extend parallel to the thickness direction of the IDT electrode. The IDT electrode is covered by a dielectric layer disposed on the piezoelectric substrate.

In the elastic wave device described in Japanese Unexamined Patent Application Publication No. 2012-175315, an IDT electrode is covered by the dielectric layer. Therefore, the IDT electrode is hardly damaged. However, there is a problem in that the fractional bandwidth is narrow due to the configuration in which the IDT electrode is covered by the dielectric layer. In addition, depending on the configuration of the metal layer of the IDT electrode, wide variations in frequency may occur.

SUMMARY OF THE INVENTION

Preferred embodiments of the present invention provide elastic wave devices, radio-frequency front-end circuits, and communication devices in each of which the fractional bandwidth is wider and variations in frequency are unlikely to occur.

An elastic wave device according to a preferred embodiment of the present invention includes a piezoelectric material layer, an IDT electrode disposed on the piezoelectric material layer, and a dielectric film that covers at least a portion of the IDT electrode. The IDT electrode includes a first electrode layer and a second electrode layer laminated on the first electrode layer. Each of the wavelength normalized film thicknesses of the first and second electrode layers is equal to or greater than about 1.25%. The wavelength normalized film thicknesses of the first and second electrode layers are normalized by using a wavelength defined by the electrode finger pitch of the IDT electrode. The second electrode layer has a density lower than a density of the first electrode layer. A side of the second electrode layer is inclined with respect to the thickness direction of the IDT electrode.

In an elastic wave device according to a preferred embodiment of the present invention, a side of the first electrode layer is inclined with respect to the thickness direction.

In an elastic wave device according to a preferred embodiment of the present invention, a side of the first electrode layer extends parallel or substantially parallel to the thickness direction. In this case, the width of the fractional bandwidth may be increased in an even wider range of the incline angle of the side of the second electrode layer.

In an elastic wave device according to a preferred embodiment of the present invention, the second electrode layer is an Al layer. A Rayleigh wave is used as a main mode. A combination of Fr, Fsh, θ, and $T_{Al}$ is a combination set forth in Table 1, where Fr is a resonant frequency of the Rayleigh wave Fr, Fsh is a resonant frequency of SH wave, θ is an incline angle of the first and second electrode layers with respect to the thickness direction, and $T_{Al}$ is the wavelength normalized film thickness of the second electrode layer. In this case, the width of the fractional bandwidth is able to be increased with more certainty.

TABLE 1

| Relationship between the resonant frequency Fr and the resonant frequency Fsh | Condition of the film thickness $T_{Al}$ (%) of the second electrode layer | Incline angle θ |
|---|---|---|
| Fsh > Fr | — | θ ≤ 3.8 × $T_{Al}$ + 4.27 |
| Fsh < Fr | $T_{Al}$ ≤ 4 | θ ≤ 3.9 × $T_{Al}$ − 0.4 |
| Fsh < Fr | $T_{Al}$ > 4 | θ ≤ 2.8 × $T_{Al}$ + 4 |

In an elastic wave device according to a preferred embodiment of the present invention, the first electrode layer is a Pt layer. The second electrode layer is an Al layer. A Rayleigh wave is used as a main mode. A combination of θ, $T_{Pt}$, and $T_{Al}$ is a combination set forth in Table 2, where θ is an incline angle of the first and second electrode layers with respect to the thickness direction, $T_{Pt}$ is the wavelength normalized film thickness of the first electrode layer, and $T_{Al}$ is the wavelength normalized film thickness of the second electrode layer. In this case, the width of the fractional bandwidth may be increased with more certainty.

TABLE 2

| Condition of the film thickness $T_{Pt}$ (%) of the first electrode layer | Condition of the film thickness $T_{Al}$ (%) of the second electrode layer | Incline angle θ |
|---|---|---|
| $T_{Pt}$ ≤ 4 | — | θ ≤ 3.8 × $T_{Al}$ + 4.27 |
| $T_{Pt}$ ≥ 6 | $T_{Al}$ ≤ 4 | θ ≤ 3.9 × $T_{Al}$ − 0.4 |
| $T_{Pt}$ ≥ 6 | $T_{Al}$ > 4 | θ ≤ 2.8 × $T_{Al}$ + 4 |

In an elastic wave device according to a preferred embodiment of the present invention, the first electrode layer is a Pt layer. The second electrode layer is a Cu layer. A Rayleigh wave is used as a main mode. A combination of θ, $T_{Pt}$, and $T_{Cu}$ is a combination set forth in Table 3, where θ is an incline angle of the first and second electrode layers with respect to the thickness direction, $T_{Pt}$ is the wavelength normalized film thickness of the first electrode layer, and $T_{Cu}$ is the wavelength normalized film thickness of the second electrode layer. In this case, the width of the fractional bandwidth may be increased with more certainty.

TABLE 3

| Condition of the film thickness $T_{Pt}$ (%) of the first electrode layer | Condition of the film thickness $T_{Cu}$ (%) of the second electrode layer | Incline angle θ |
|---|---|---|
| $2 \le T_{Pt} < 7$ | $T_{Cu} < 3$ | $θ \le 3.3 \times T_{Cu} - 3.3$ |
| $2 \le T_{Pt} < 7$ | $T_{Cu} \ge 3$ | $θ \le 1.3 \times T_{Cu} + 2.4$ |
| $T_{Pt} \ge 7$ | — | $θ \le 3.3 \times T_{Cu} - 3.3$ |

In an elastic wave device according to a preferred embodiment of the present invention, the first electrode layer is a Mo layer. The second electrode layer is an Al layer. A Rayleigh wave is used as a main mode, and $θ \le 2.2 \times T_{Al} + 12.1$, where θ is an incline angle of the first and second electrode layers with respect to the thickness direction, and $T_{Al}$ is the wavelength normalized film thickness of the second electrode layer. In this case, the width of the fractional bandwidth may be increased with more certainty.

In an elastic wave device according to a preferred embodiment of the present invention, the wavelength normalized film thickness $T_{Al}$ of the second electrode layer is equal to or greater than about 2%. In this case, the width of the fractional bandwidth may be increased with even more certainty.

A radio-frequency front-end circuit according to a preferred embodiment of the present invention includes an elastic wave device according to a preferred embodiments of the present invention, and a power amplifier.

A communication device according to a preferred embodiment of the present invention includes a radio-frequency front-end circuit according to a preferred embodiments of the present invention, and an RF signal processing circuit.

Preferred embodiments of the present invention provide elastic wave devices, radio-frequency front-end circuits, and communication devices in each of which the fractional bandwidth is wider and variations in frequency are unlikely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
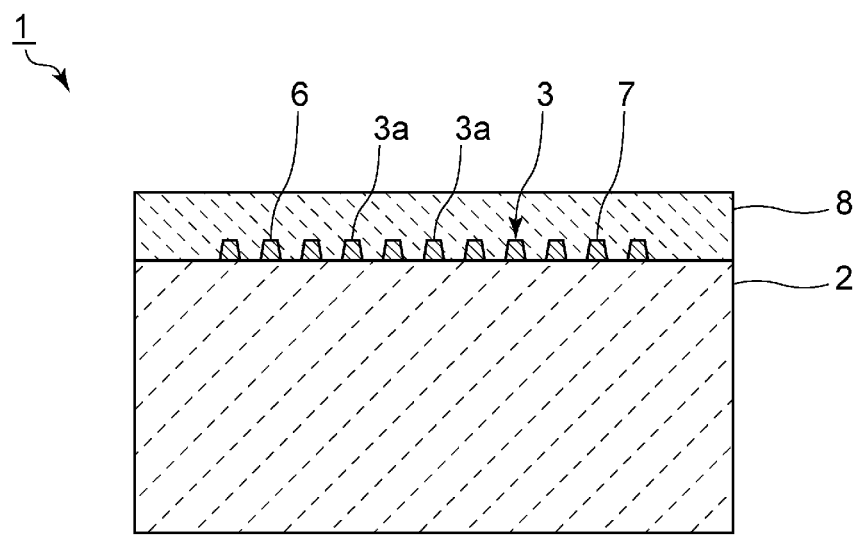
FIG. 1 is a front sectional view of an elastic wave device according to a first preferred embodiment of the present invention.

Referring to the drawings, preferred embodiments of the present invention will be described.

It is to be noted that the preferred embodiments described herein are exemplary and a subset of the components may be replaced or combined between different preferred embodiments.

FIG. 1 is a front sectional view of an elastic wave device according to a first preferred embodiment of the present invention.

An elastic wave device 1 includes a piezoelectric material layer 2. The piezoelectric material layer 2 is preferably, for example, a lithium niobate layer with a cut angle of about 126°. However, the material and the cut angle of the piezoelectric material layer 2 are not limited those described above. The piezoelectric material layer 2 may be a lithium tantalate layer. Alternatively, the piezoelectric material layer 2 may be a piezoelectric monocrystalline layer or other suitable piezoelectric material other than a lithium tantalate layer and a lithium niobate layer.

An interdigital transducer (IDT) electrode 3 is disposed on the piezoelectric material layer 2. The IDT electrode 3 includes a plurality of electrode fingers 3a. An alternating voltage is applied to the IDT electrode 3 so that elastic waves are excited. In the first preferred embodiment, Rayleigh waves are used as the main mode. When Rayleigh waves are used as the main mode, shear horizontal (SH) waves appear as ripples of unnecessary waves. A reflector 6 and a reflector 7 are disposed on the both sides of the IDT electrode 3 in the propagation direction of elastic waves. Thus, the elastic wave device 1 according to the first preferred embodiment is an elastic wave resonator.

Figure 2:
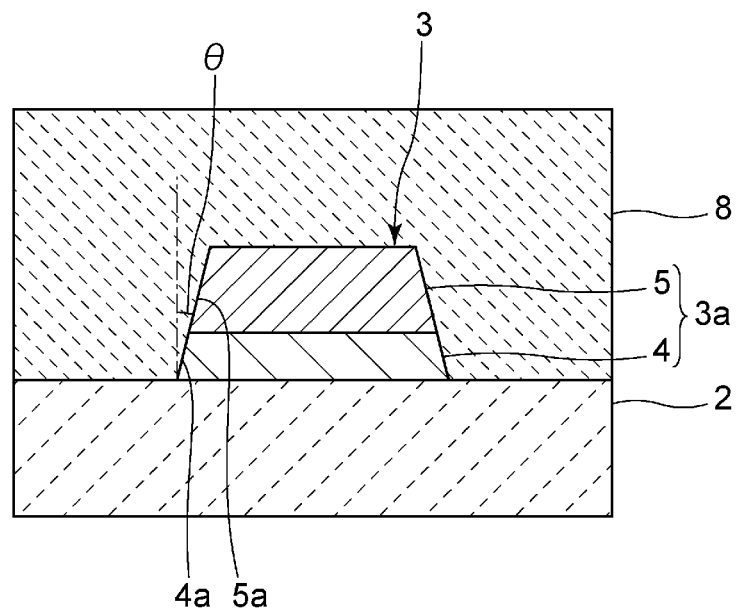
FIG. 2 is an enlarged front sectional view of an electrode finger of an interdigital transducer (IDT) electrode and a portion near the electrode finger, according to the first preferred embodiment of the present invention.

FIG. 2 is an enlarged front sectional view of an electrode finger of an IDT electrode and a portion near the electrode finger, according to the first preferred embodiment.

The IDT electrode 3 is a laminated metal layer including a plurality of metal layers that are laminated. The film thickness of each metal layer, which is normalized by using the wave length defined by the electrode finger pitch of the IDT electrode 3, is denoted as a wavelength normalized film thickness (%). The plurality of metal layers of the IDT electrode 3 include a plurality of electrode layers which are metal layers preferably having a wavelength normalized film thickness of about 1.25% or greater, for example.

More specifically, the IDT electrode 3 includes a first electrode layer 4 and a second electrode layer 5. The first electrode layer 4 is positioned closest to the piezoelectric material layer 2. The second electrode layer 5 is laminated on the first electrode layer 4. The wavelength normalized film thickness of the first electrode layer 4 is preferably about 2%, for example. The wavelength normalized film thickness of the second electrode layer 5 is preferably about 5%, for example. The wavelength normalized film thicknesses of the first electrode layer 4 and the second electrode layer 5 are not limited to those described above. The wavelength defined by the electrode finger pitch of the IDT electrode 3 is not particularly limiting, and is preferably about 4 µm, for example in the first preferred embodiment.

The first electrode layer 4 has a density that is the highest among the electrode layers whose wavelength normalized film thicknesses are preferably equal to or greater than about 1.25%, for example. The second electrode layer 5 has a density that is lower than the density of the first electrode layer 4. As long as the density of the first electrode layer 4 is higher than the density of the second electrode layer 5, any configuration may be used. An electrode layer whose density is higher than the density of the first electrode layer 4 may be included in the IDT electrode 3.

The material of the first electrode layer 4 is not particularly limiting, and is preferably Pt, for example in the first preferred embodiment. The material of the second electrode layer 5 is not particularly limiting, and is preferably Al, for example, in the first preferred embodiment. For example, a combination of the materials of the first electrode layer 4 and the second electrode layer 5 may preferably be Pt and Ti, Pt and Cu, Pt and Mo, Mo and Al, Cu and Al, or other suitable combinations.

The configuration of the IDT electrode 3 is not limited to that described above. Any configuration may be used as long as, for example, the following conditions are satisfied: the IDT electrode 3 includes a plurality of electrode layers having a wavelength normalized film thickness of about 1.25% or greater; the first electrode layer 4 is positioned closer to the piezoelectric material layer 2 than the second electrode layer 5. The IDT electrode 3 may include a metal layer having a wavelength normalized film thickness less than about 1.25%. The elastic wave device 1 preferably includes the second electrode layer 5 that is laminated directly on the first electrode layer 4. However, the second electrode layer 5 may be laminated indirectly on the first electrode layer 4 with a different metal layer interposed in between.

As illustrated in FIG. 2, the first electrode layer 4 includes a side 4a. The second electrode layer 5 also includes a side 5a. The side 4a of the first electrode layer 4 and the side 5a of the second electrode layer 5 are inclined with respect to the thickness direction of the IDT electrode 3. The incline angle with respect to the thickness direction of the IDT electrode 3 is represented by θ. A positive incline angle θ indicates an incline towards the inside of an electrode finger 3a. The incline angle θ of the side 4a of the first electrode layer 4 is preferably the same or substantially the same as the incline angle θ of the side 5a of the second electrode layer 5 in the first preferred embodiment. The incline angles θ of the sides of the metal layers of the IDT electrode 3 may be different from one another. As long as the IDT electrode 3 has a configuration in which at least the side 5a of the second electrode layer 5 is inclined with respect to the thickness direction, any configuration may be used.

A dielectric film 8 is disposed on the piezoelectric material layer 2 so as to cover the IDT electrode 3. The dielectric film 8 is preferably made of silicon oxide represented by $SiO_x$, for example. In the first preferred embodiment, the dielectric film 8 is preferably made of $SiO_2$, for example. The dielectric film 8 may be made of silicon oxide in which x is a positive number. Alternatively, the dielectric film 8 may be made of dielectric other than silicon oxide. The wavelength normalized film thickness of the dielectric film 8 is not particularly limiting, and is preferably about 30%, for example, in the first preferred embodiment. Herein, the film thickness of the dielectric film 8 indicates the film thickness measured from the principal surface of the piezoelectric material layer 2, on which the dielectric film 8 is disposed.

The elastic wave device 1 according to the first preferred embodiment has the following configuration. The elastic wave device 1 includes the piezoelectric material layer 2, the IDT electrode 3 disposed on the piezoelectric material layer 2, and the dielectric film 8 covering the IDT electrode 3. The IDT electrode 3 includes the first electrode layer 4 and the second electrode layer 5 laminated on the first electrode layer 4. Each of the wavelength normalized film thicknesses of the first electrode layer 4 and the second electrode layer 5 is preferably equal to or greater than about 1.25%, for example. The second electrode layer 5 has a density lower than that of the first electrode layer 4. The side 5a of the second electrode layer 5 is inclined with respect to the thickness direction of the IDT electrode 3. This configuration achieves a wider fractional bandwidth, and also makes variations in frequency unlikely to occur. This will be described below, for example, with comparison of the first preferred embodiment with first to fourth comparative examples.

Multiple elastic wave devices having the configuration according to the first preferred embodiment were made with the incline angle θ of the side 4a of the first electrode layer 4 and the side 5a of the second electrode layer 5 being changed. In addition, elastic wave devices according to the first comparative example and the second comparative example were made. The first comparative example is different from the first preferred embodiment in that the incline angle θ of the sides of the first and second electrode layers is about 0°. The second comparative example is different from the first preferred embodiment in that the IDT electrode includes only the first electrode layer. Multiple elastic wave devices according to the second comparative example were made with the incline angle θ of the side of the metal layer being changed. The fractional bandwidths Δf of the elastic wave devices described above were measured.

The fractional bandwidth of an elastic wave device in which the incline angle θ of the sides of all of the metal layers of the IDT electrode is about 0° is represented by $\Delta f_0$. A value obtained by dividing the fractional bandwidth Δf of an elastic wave device, in which the incline angle θ of the side of at least one metal layer of the IDT electrode is greater than 0°, by the fractional bandwidth $\Delta f_0$ is denoted as a Δf ratio. At that time, the Δf ratio may be expressed as $\Delta f/\Delta f_0$. The elastic wave device for which the fractional bandwidth $\Delta f_0$ is measured has the same or substantially the same condition as an elastic wave device for which the fractional bandwidth Δf is measured, except for the incline angle θ. As in the first comparative example, the Δf ratio of an elastic wave device in which the incline angle θ of the sides of all the metal layers of the IDT electrode is 0° is set to 1. The fractional bandwidth Δf of each elastic wave device having the configuration according to the first preferred embodiment was divided by the fractional bandwidth Δf of the first comparative example. Thus, the Δf ratio of each elastic wave device having the configuration according to the first preferred embodiment was calculated. Similarly, the fractional bandwidth Δf of each elastic wave device according to the second comparative example was divided by the fractional bandwidth Δf of the first comparative example. Thus, the Δf ratio of each elastic wave device according to the second comparative example was calculated.

Figure 3:
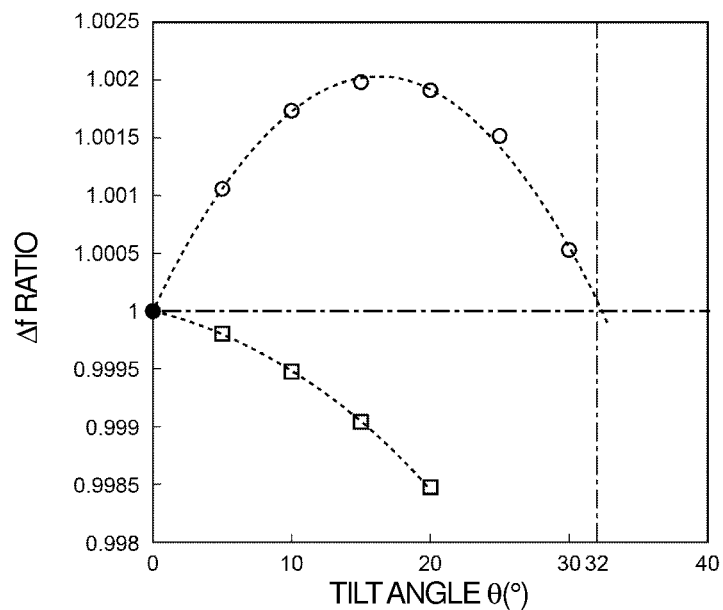
FIG. 3 is a diagram illustrating the relationship between incline angle θ and Δf ratio, in the first preferred embodiment, a first comparative example, and a second comparative example of the present invention.

FIG. 3 is a diagram illustrating the relationship between incline angle θ and Δf ratio, in the first preferred embodiment, the first comparative example, and the second comparative example. In acquiring the relationship in FIG. 3, the first electrode layer is a Pt layer of a wavelength normalized film thickness of about 2%; the second electrode layer is an Al layer of a wavelength normalized film thickness of about 5%, for example. In FIG. 3, the white circular plots indicate the result of the first preferred embodiment. The black circular plot indicates the result of the first comparative example. The rectangular plots indicate the result of the second comparative example.

As illustrated in FIG. 3, in the first preferred embodiment in which the side of the second electrode layer is inclined with respect to the thickness direction of the IDT electrode, the Δf ratios are greater than 1, and a wider fractional bandwidth Δf is obtained compared with the first comparative example in which the incline angle θ of the sides of the first and second electrode layers is about 0°. More specifically, when the incline angle θ satisfies the condition, 0°<θ<32°, a wider fractional bandwidth Δf is obtained compared with the first comparative example.

In contrast, the Δf ratios of the second comparative example are less than 1, and the fractional bandwidth Δf is narrower than the first comparative example. Thus, in the case in which the IDT electrode includes only a single layer, when the side of the electrode layer is inclined with respect to the thickness direction of the IDT electrode, the fractional bandwidth Δf is narrower than the case in which the incline angle θ is about 0°. The elastic wave device 1 according to the first preferred embodiment not only includes the side 5a of the second electrode layer 5 which is inclined with respect to the thickness direction, but also includes the first electrode layer 4 and the second electrode layer 5 which are a plurality of electrode layers whose wavelength normalized film thicknesses are equal to or greater than about 1.25%, for example. Thus, the fractional bandwidth Δf is able to be effectively made wider.

As described above, when the wavelength normalized film thickness of the second electrode layer is about 5%, it is preferable that the incline angle θ satisfy the condition, 0°<θ<32°, for example. Preferable ranges of the wavelength normalized film thicknesses of the first and second electrode layers and the incline angle will be described in detail below.

The elastic wave device 1 according to the first preferred embodiment achieves a wider fractional bandwidth due to the configuration in which the side 5a of the second electrode layer 5 is inclined with respect to the thickness direction of the IDT electrode 3. This will be described below by comparing the first preferred embodiment with the third comparative example.

Figure 4:
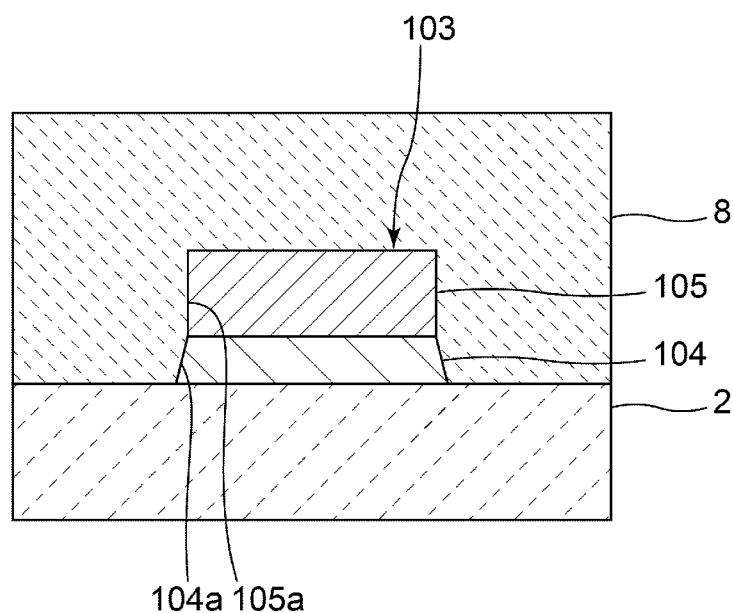
FIG. 4 is a front sectional view of an electrode finger of an IDT electrode and a portion near the electrode finger, according to a third comparative example.

FIG. 4 is a front sectional view of an electrode finger of an IDT electrode and a portion near the electrode finger, according to the third comparative example.

In an elastic wave device according to the third comparative example, a side 104a of a first electrode layer 104 is inclined with respect to the thickness direction of an IDT electrode 103, and a side 105a of a second electrode layer 105 extends parallel or substantially parallel to the thickness direction. Multiple elastic wave devices according to the third comparative example were made with the incline angle θ of the side 104a of the first electrode layer 104 being changed.

Figure 5:
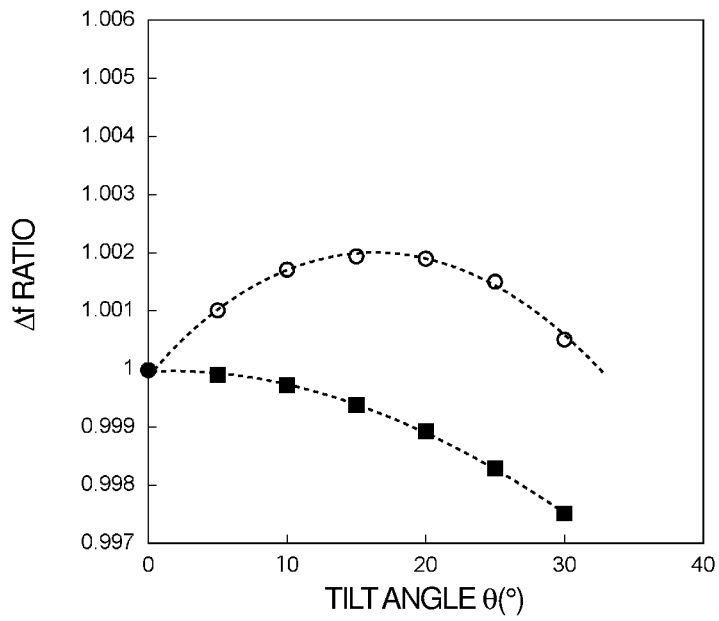
FIG. 5 is a diagram illustrating the relationship between incline angle θ and Δf ratio, in the first preferred embodiment, the first comparative example, and the third comparative example of the present invention.

FIG. 5 is a diagram illustrating the relationship between incline angle θ and Δf ratio, in the first preferred embodiment, the first comparative example, and the third comparative example. In acquiring the relationship in FIG. 5, the first electrode layer is a Pt layer of a wavelength normalized film thickness of about 2%; the second electrode layer is an Al layer of a wavelength normalized film thickness of about 5%, for example. In FIG. 5, the white circular plots indicate the result of the first preferred embodiment. The black rectangular plots indicate the result of the third comparative example. The black circular plot indicates the result of the first comparative example.

As illustrated in FIG. 5, in the third comparative example, the Δf ratios are less than 1, and the fractional bandwidth Δf is narrower than that of the first comparative example. Thus, in the case in which the side 105a of the second electrode layer 105 is not inclined with respect to the thickness direction of the IDT electrode 103, if the side 104a of the first electrode layer 104 is inclined with respect to the thickness direction, the fractional bandwidth Δf is narrower compared with when the incline angle θ is about 0°, for example. In the elastic wave device 1 according to the first preferred embodiment, the side 5a of the second electrode layer 5 is inclined with respect to the thickness direction. Therefore, the fractional bandwidth Δf is able to be effectively made wider.

The elastic wave device 1 according to the first preferred embodiment achieves a wider fractional bandwidth due to the configuration in which the first electrode layer having a density higher than the second electrode layer is positioned closer to the piezoelectric material layer 2 than the second electrode layer. This will be described below by comparing the first preferred embodiment with the fourth comparative example.

The fourth comparative example is different from the first preferred embodiment in that the second electrode layer is positioned closer to the piezoelectric material layer than the first electrode layer. Multiple elastic wave devices according to the fourth comparative example were made with the incline angle θ of the sides of the first and second electrode layers being changed (θ includes 0°). The fractional bandwidths Δf of the multiple elastic wave devices according to the fourth comparative example were measured.

Figure 6:
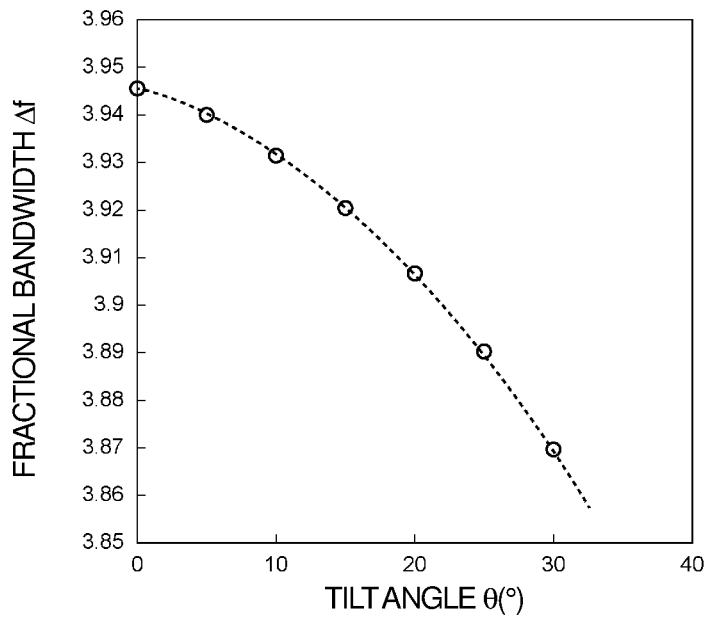
FIG. 6 is a diagram illustrating the relationship between fractional bandwidth Δf and incline angle θ of sides of first and second electrode layers of an IDT electrode, in a fourth comparative example.

FIG. 6 is a diagram illustrating the relationship between incline angle θ of the sides of the first and second electrode layers of the IDT electrode and fractional bandwidth Δf, in the fourth comparative example. In acquiring the relationship in FIG. 6, the first electrode layer is a Pt layer of a wavelength normalized film thickness of about 2%; the second electrode layer is an Al layer of a wavelength normalized film thickness of about 5%, for example.

As illustrated in FIG. 6, in the fourth comparative example, it was discovered that the fractional bandwidths Δf obtained in the case in which the incline angle θ of the sides of the first and second electrode layers is greater than 0° are narrower than that obtained in the case in which the incline angle θ is 0°. Thus, when the second electrode layer having a low density is positioned closer to the piezoelectric material layer than the first electrode layer having a high density, the greater the incline angle θ is, the narrower the fractional bandwidth Δf is. In contrast, the first preferred embodiment achieves a wider fractional bandwidth as illustrated in FIGS. 3 and 5 due to the configuration in which the first electrode layer 4 is positioned closer to the piezoelectric material layer 2 than the second electrode layer 5.

Difficulty in occurrence of variations in frequency in the first preferred embodiment will be described below. A value obtained by dividing the resonant frequency of an elastic wave device, in which the incline angle θ of the side of at least one metal layer of the IDT electrode is greater than 0°, by the resonant frequency of an elastic wave device, in which the incline angle θ is 0°, is denoted as a fr ratio. The elastic wave device, in which the incline angle θ is greater than 0°, has the same or substantially the same configuration as the elastic wave device, in which the incline angle θ is 0°, except for the incline angle θ. The resonant frequency of an elastic wave device, in which the incline angle θ of the sides of all the metal layers of the IDT electrode is 0°, is represented by $fr_0$. The fr ratio may be expressed as $fr/fr_0$. The fr ratio of an elastic wave device, in which the incline angle θ of the sides of all the metal layers of the IDT electrode is 0°, is set to 1. The resonant frequency of each elastic wave device having the configuration according to the first preferred embodiment was divided by the resonant frequency of an elastic wave device according to the first comparative example. Thus, the fr ratios for the first preferred embodiment were obtained. Similarly, the fr ratios of the elastic wave devices according to the fourth comparative example were obtained. The resonant frequency used in the calculation of a fr ratio is the resonant frequency in the main mode.

Figure 7:
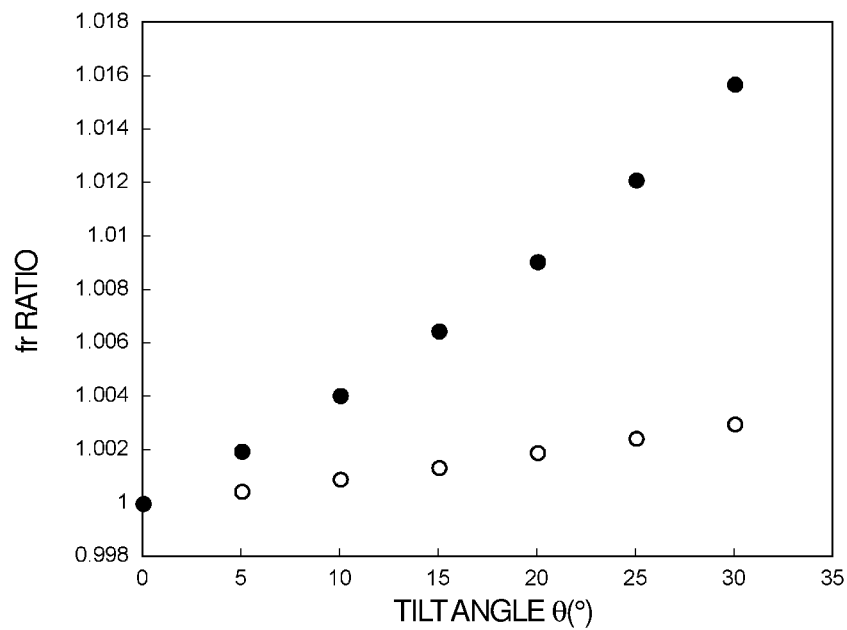
FIG. 7 is a diagram illustrating the relationship between fr ratio and incline angle θ of sides of first and second electrode layers of an IDT electrode, in the first preferred embodiment and the fourth comparative example of the present invention.

FIG. 7 is a diagram illustrating the relationship between incline angle θ of the sides of the first and second electrode layers of the IDT electrode and fr ratio, in the first preferred embodiment and the fourth comparative example. In FIG. 7, the white circular plots indicate the result of the first preferred embodiment. The black circular plots indicate the result of the fourth comparative example.

As illustrated in FIG. 7, in the fourth comparative example, the change in fr ratio is large with respect to the change in incline angle θ. Therefore, when variations in incline angle θ occur in a manufacturing process, wide variations in frequency occur. In contrast, in the first preferred embodiment, it was discovered that, even when the incline angle θ changes, the change in fr ratio is small. Therefore, in the first preferred embodiment, even when variations in incline angle θ occur in a manufacturing process, variations in frequency are difficult to occur. As described above, the first preferred embodiment achieves a wider fractional bandwidth Δf, and makes variations in frequency difficult to occur.

An effect that a wider fractional bandwidth may be obtained due to the configuration in which the wavelength normalized film thicknesses of the first electrode layer 4 and the second electrode layer 5 are equal to or greater than about 1.25% will be described below.

Multiple elastic wave devices having a configuration similar to the first preferred embodiment except that the incline angle θ of the side of the first electrode layer is 0° and that the incline angle θ of the side of the second electrode layer is about 5° were made with the wavelength normalized film thickness of the second electrode layer being changed. Further, multiple elastic wave devices according to the first comparative example in which the incline angle θ of the sides of the first and second electrode layers is 0° were made with the wavelength normalized film thickness of the second electrode layer being changed. Then, the Δf ratios of the elastic wave devices were calculated.

Figure 8:
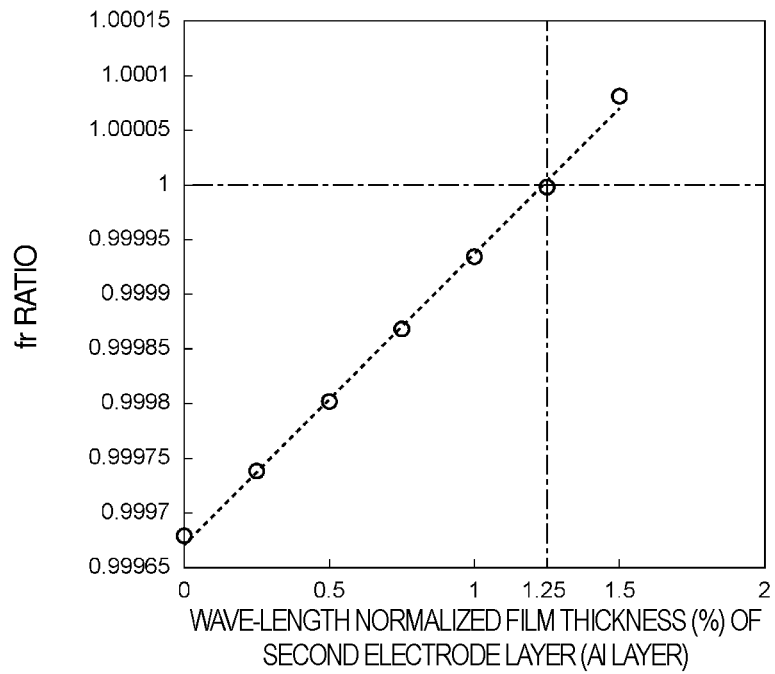
FIG. 8 is a diagram illustrating the relationship between Δf ratio and wavelength normalized film thickness of a second electrode layer (Al layer) whose side is inclined with respect to the thickness direction of an IDT electrode, in the case in which the IDT electrode includes a first electrode layer (Pt layer) whose wavelength normalized film thickness is equal to or greater than about 1.25%.

FIG. 8 is a diagram illustrating the relationship between wavelength normalized film thickness of the second electrode layer (Al layer) and Δf ratio, which is obtained in the case in which the IDT electrode includes the first electrode layer (Pt layer) whose wavelength normalized film thickness is equal to or greater than about 1.25%, for example. The second electrode layer (Al layer) has a side inclined with respect to the thickness direction of the IDT electrode. In acquiring the relationship in FIG. 8, the first electrode layer is a Pt layer of a wavelength normalized film thickness of about 2%; the second electrode layer is an Al layer, for example.

As illustrated in FIG. 8, it was discovered that, in the case in which the wavelength normalized film thickness of a metal layer whose side is inclined with respect to the thickness direction of the IDT electrode is less than about 1.25%, the Δf ratios are less than about 1, for example. In contrast, it was discovered that, in the case in which the wavelength normalized film thickness of the second electrode layer is equal to or greater than about 1.25%, the Δf ratios are equal to or greater than about 1, for example. Therefore, an electrode layer of a wavelength normalized film thickness of about 1.25% or greater is able to effectively make the fractional bandwidth wider.

As illustrated in FIG. 3, when the wavelength normalized film thickness of the second electrode layer is about 5%, it is preferable that the incline angle θ satisfy the condition, $0°<\theta<32°$, for example. Preferable ranges of the wavelength normalized film thicknesses of the first and second electrode layers and the incline angle will be described in detail below.

Multiple elastic wave devices having the configuration according to the first preferred embodiment were made with the wavelength normalized film thicknesses of the first electrode layer 4 and the second electrode layer 5 and the incline angle θ of the sides being changed. Multiple elastic wave devices according to the first comparative example in which the incline angle θ is 0° were made with the wavelength normalized film thicknesses of the first and second electrode layers being changed. The fractional bandwidths Δf of the multiple elastic wave devices were measured. The Δf ratios of the elastic wave devices having the configuration according to the first preferred embodiment were calculated. The incline angle θ at which the Δf ratio is equal to about 1 is denoted as the incline angle θ1. The incline angle θ1 was obtained for each wavelength normalized film thickness set of the first electrode layer 4 and the second electrode layer 5. The impedance frequency characteristics of the multiple elastic wave devices were also measured.

Figure 9:
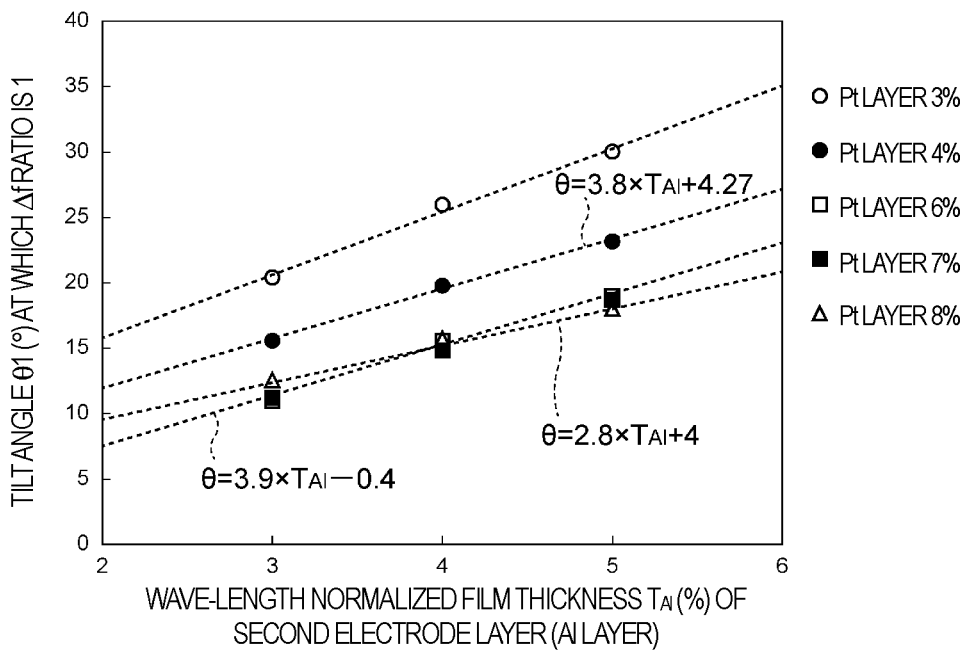
FIG. 9 is a diagram illustrating the relationship between wavelength normalized film thicknesses of first and second electrode layers and incline angle θ1, at which the Δf ratio is equal to about 1, of sides of the first and second electrode layers, in the first preferred embodiment of the present invention.

FIG. 9 is a diagram illustrating the relationship between wavelength normalized film thicknesses of the first and second electrode layers and incline angle θ1, at which the Δf ratio is equal to about 1, of the sides of the first and second electrode layers, in the first preferred embodiment. In acquiring the relationship in FIG. 9, the first electrode layer is a Pt layer; the second electrode layer is an Al layer. In FIG. 9, the white circular plots indicate the result of a Pt layer of a wavelength normalized film thickness of about 3%. The black circular plots indicate the result of a Pt layer of a wavelength normalized film thickness of about 4%. The white rectangular plots indicate the result of a Pt layer of a wavelength normalized film thickness of about 6%. The black rectangular plots indicate the result of a Pt layer of a wavelength normalized film thickness of about 7%. The triangular plots indicate the result of a Pt layer of a wavelength normalized film thickness of about 8%.

As illustrated in FIG. 9, the larger the wavelength normalized film thickness of the second electrode layer 5 is, the greater the incline angle θ1, at which the Δf ratio is about 1, is. As illustrated in FIG. 3, in the range in which the incline angle θ satisfies the condition, $0°<\theta \leq \theta 1$, the Δf ratio is equal to or greater than about 1, thus achieving a wider fractional bandwidth Δf.

The tendency of the change in the incline angle θ, at which Δf is equal to about 1, with respect to the change of the wavelength normalized film thickness of the second electrode layer 5 is different between the case in which the wavelength normalized film thickness of the Pt layer which is the first electrode layer 4 is equal to or less than about 4% and the case in which the wavelength normalized film thickness is equal to or greater than about 6%, for example. This may occur because the relationship between the resonant frequency of Rayleigh waves, which are the main mode, and the resonant frequency of SH waves is different between the case in which the wavelength normalized film thickness of the first electrode layer 4 is equal to or less than about 4% and the case in which the wavelength normalized film thickness is equal to or greater than about 6%, for example. As exemplary evidence showing this, FIG. 10 illustrates an exemplary impedance characteristic exhibited in the case in which the wavelength normalized film thickness of the first electrode layer 4 is equal to or less than about 4%, and FIG. 11 illustrates an exemplary impedance characteristic exhibited in the case in which the wavelength normalized film thickness is equal to or greater than about 6%, for example.

Figure 10:
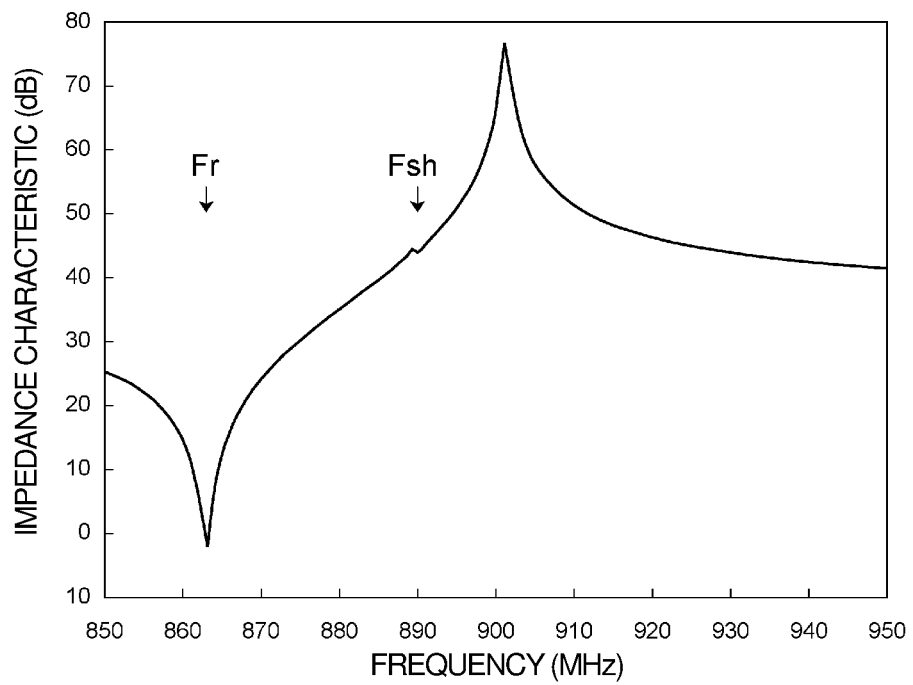
FIG. 10 is a diagram illustrating the impedance frequency characteristic exhibited in the case in which the wavelength normalized film thickness of a first electrode layer is equal to about 3%, in the first preferred embodiment of the present invention.
Figure 11:
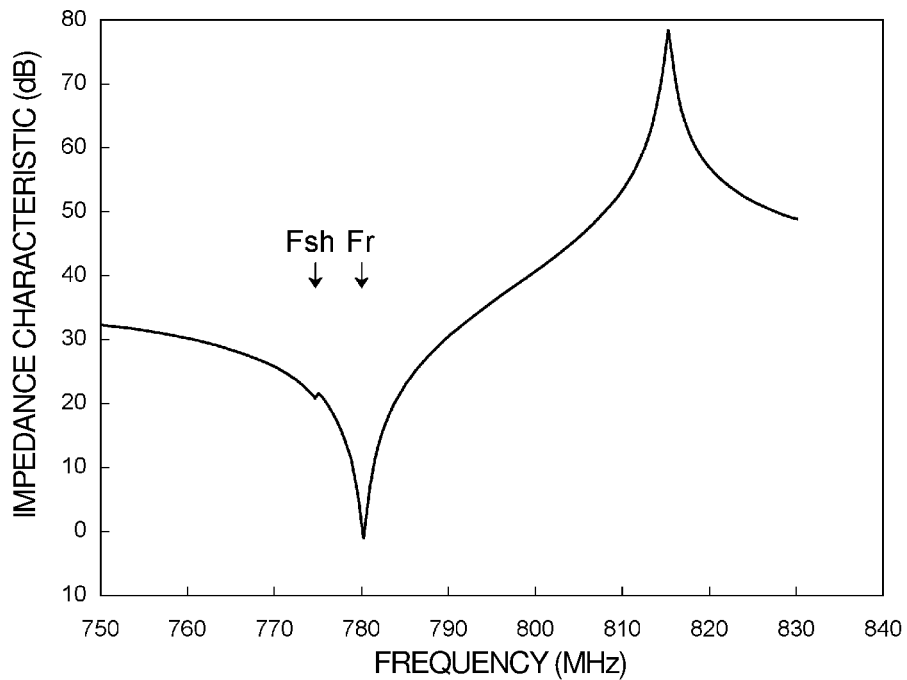
FIG. 11 is a diagram illustrating the impedance frequency characteristic exhibited in the case in which the wavelength normalized film thickness of a first electrode layer is equal to about 7%, in the first preferred embodiment of the present invention.

FIG. 10 is a diagram illustrating the impedance frequency characteristic exhibited when the wavelength normalized film thickness of the first electrode layer is about 3%, for example, according to the first preferred embodiment. FIG. 11 is a diagram illustrating the impedance frequency characteristic exhibited when the wavelength normalized film thickness of the first electrode layer is about 7%, for example, according to the first preferred embodiment.

The resonant frequency of Rayleigh waves is represented by Fr, and the resonant frequency of SH waves is represented by Fsh. As illustrated in FIG. 10, it is discovered that, when the wavelength normalized film thickness of the first electrode layer is about 3%, the relationship, Fsh>Fr, is maintained. As illustrated in FIG. 11, it was discovered that, when the wavelength normalized film thickness of the first electrode layer 4 is about 7%, the relationship, Fsh<Fr, is maintained. It has been discovered that, when the wavelength normalized film thickness of the first electrode layer 4 is close to about 5%, for example, Fr is substantially equal to Fsh (not illustrated).

Therefore, for example, when the wavelength normalized film thickness of the first electrode layer 4 is equal to or less than about 4%, the relationship, Fsh>Fr, is able to be maintained; when the wavelength normalized film thickness of the first electrode layer 4 is equal to or greater than about 6%, the relationship, Fsh<Fr, is able to be maintained.

In the first preferred embodiment, the wavelength normalized film thickness of the first electrode layer 4 which is a Pt layer is represented by $T_{Pt}$; the wavelength normalized film thickness of the second electrode layer 5 which is an Al layer is represented by $T_{Al}$. In FIG. 9, in the case in which the wavelength normalized film thickness $T_{Pt}$ of the first electrode layer 4 is equal to or less than about 4% (Fsh>Fr), if incline angle $\theta \leq 3.8 \times T_{Al} + 4.27$, the Δf ratio is able to be made equal to or greater than about 1 with more certainty, thus achieving a wider fractional bandwidth Δf. In contrast, in the case in which the wavelength normalized film thickness $T_{Pt}$ of the first electrode layer 4 is equal to or greater than about 6% (Fsh<Fr), and the wavelength normalized film thickness $T_{Al}$ of the second electrode layer 5 is equal to or less than about 4%, if incline angle $\theta \leq 3.9 \times T_{Al} - 0.4$, the Δf ratio is able to be made equal to or greater than about 1 with more certainty. In the case in which the wavelength normalized film thickness $T_{Pt}$ of the first electrode layer 4 is equal to or greater than about 6% (Fsh<Fr), and the wavelength normalized film thickness $T_{Al}$ of the second electrode layer is greater than about 4%, if incline angle $\theta \leq 2.8 \times T_{Al} + 4$, the Δf ratio is able to be made equal to or greater than about 1 with more certainty. The conditions enabling the Δf ratio to be equal to or greater than about 1 with more certainty are collectively illustrated in Table 3 and Table 4 described below.

TABLE 3

| Relationship between the resonant frequency Fr and the resonant frequency Fsh | Condition of the film thickness $T_{Al}$ (%) of the second electrode layer | Incline angle θ |
|---|---|---|
| Fsh > Fr | — | $\theta \leq 3.8 \times T_{Al} + 4.27$ |
| Fsh < Fr | $T_{Al} \leq 4$ | $\theta \leq 3.9 \times T_{Al} - 0.4$ |
| Fsh < Fr | $T_{Al} > 4$ | $\theta \leq 2.8 \times T_{Al} + 4$ |

TABLE 4

| Condition of film thickness $T_{Pt}$ (%) of the first electrode layer | Condition of the film thickness $T_{Al}$ (%) of the second electrode layer | Incline angle θ |
|---|---|---|
| $T_{Pt} \leq 4$ | — | $\theta \leq 3.8 \times T_{Al} + 4.27$ |
| $T_{Pt} \geq 6$ | $T_{Al} \leq 4$ | $\theta \leq 3.9 \times T_{Al} - 0.4$ |
| $T_{Pt} \geq 6$ | $T_{Al} > 4$ | $\theta \leq 2.8 \times T_{Al} + 4$ |

A combination of the resonant frequency Fr, the resonant frequency Fsh, the incline angle θ, and the wavelength normalized film thickness $T_{Al}$ is set to a combination set forth in Table 3. In this case, the Δf ratio is able to be made equal to or greater than about 1 with more certainty, thus achieving a wider fractional bandwidth Δf with more certainty. Similarly, a combination of the incline angle θ, the wavelength normalized film thickness $T_{Pt}$, and the wavelength normalized film thickness $T_{Al}$ is set to a combination set forth in Table 4. In this case, the Δf ratio is able to be made equal to or greater than about 1 with more certainty, thus achieving a wider fractional bandwidth Δf with more certainty.

In the first preferred embodiment, the IDT electrode 3 preferably includes two electrode layers having a wavelength normalized film thickness equal to or greater than about 1.25%, for example. Alternatively, the IDT electrode 3 may include three or more electrode layers having a wavelength normalized film thickness equal to or greater than about 1.25%, for example.

A first modified example and a second modified example of the first preferred embodiment will be described below. Also in the first modified example and the second modified example, similarly to the first preferred embodiment, a wider fractional bandwidth Δf is achieved, and variations in frequency are unlikely to occur.

Figure 12:
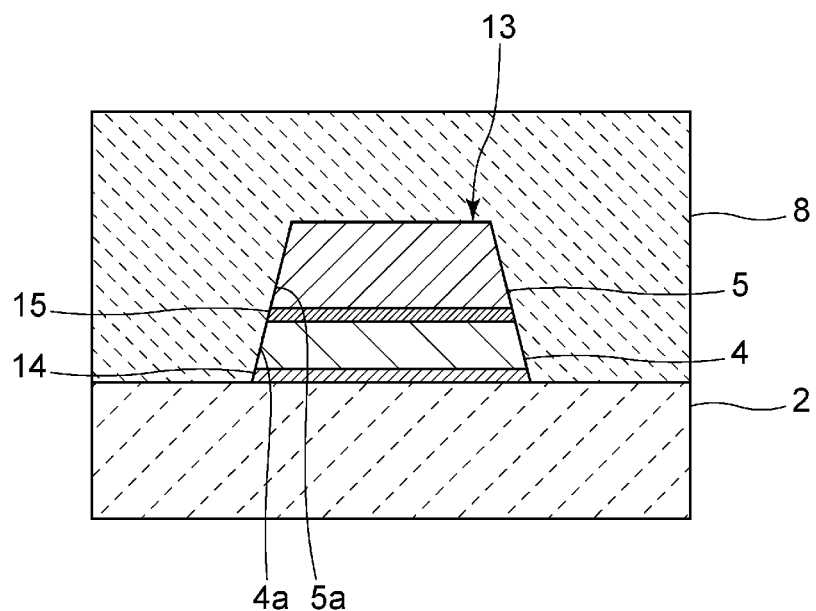
FIG. 12 is an enlarged front sectional view of an electrode finger of an IDT electrode and a portion near the electrode finger, in a first modified example of the first preferred embodiment of the present invention.

FIG. 12 is an enlarged front sectional view of an electrode finger of an IDT electrode and a portion near the electrode finger, according to the first modified example of the first preferred embodiment.

The first modified example is different from the first preferred embodiment in that an IDT electrode 13 includes metal layers whose wavelength normalized film thicknesses are preferably less than about 1.25%, for example. Other than this, the first modified example has a configuration the same as or similar to that of the first preferred embodiment.

More specifically, an adhesive layer 14 whose wavelength normalized film thickness is less than about 1.25%, for example, is preferably disposed between the piezoelectric material layer 2 and the first electrode layer 4. A diffusion prevention layer 15 whose wavelength normalized film thickness is less than about 1.25%, for example, is preferably disposed between the first electrode layer 4 and the second electrode layer 5. Thus, adhesiveness between the IDT electrode 13 and the piezoelectric material layer 2 is improved, and interdiffusion between the first electrode layer 4 and the second electrode layer 5 is reduced or prevented. The adhesive layer 14 is not particularly limiting, and is preferably, for example, a Ti layer or a NiCr layer. The diffusion prevention layer 15 is not particularly limiting, and is preferably, for example, a Ti layer. Thus, a metal layer whose wavelength normalized film thickness is less than about 1.25% may be included. The side of a metal layer whose wavelength normalized film thickness is less than about 1.25% may also be inclined with respect to the thickness direction of the IDT electrode 13.

Figure 13:
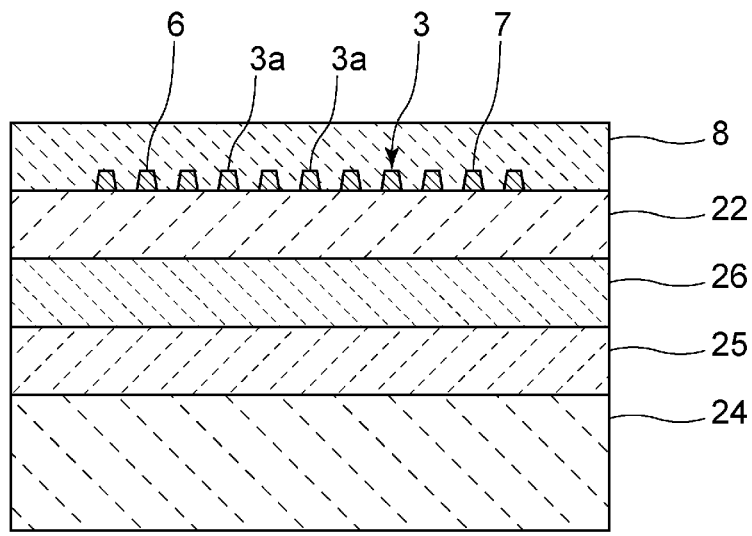
FIG. 13 is a front sectional view of an elastic wave device according to a second modified example of the first preferred embodiment of the present invention.

FIG. 13 is a front sectional view of an elastic wave device according to the second modified example of the first preferred embodiment.

The elastic wave device according to the second modified example includes a support substrate 24, a high-acoustic-velocity film 25 disposed on the support substrate 24, and a low-acoustic-velocity film 26 disposed on the high-acoustic-velocity film 25. A piezoelectric material layer 22 is disposed on the low-acoustic-velocity film 26.

The high-acoustic-velocity film 25, has an acoustic velocity of propagating bulk waves that is higher than the acoustic velocity of elastic waves propagating in the piezoelectric material layer 22. Examples of the material of the high-acoustic-velocity film 25 include piezoelectric materials, such as aluminum nitride, aluminum oxide, silicon carbide, silicon nitride, silicon oxynitride, silicon, diamond like carbon (DLC) film, silicone, sapphire, lithium tantalate, lithium niobate, and crystal, various ceramics, such as alumina, zirconia, cordierite, mullite, steatite, and forsterite, diamond, magnesia, a material whose main component is included in the above materials, and a material whose main component is a mixture of the above materials. As long as the material of the high-acoustic-velocity film 25 has a relatively high acoustic velocity, any material may be used.

The low-acoustic-velocity film 26 has an acoustic velocity of propagating bulk waves that is lower than the acoustic velocity of elastic waves propagating in the piezoelectric material layer 22. Examples of the material of the low-acoustic-velocity film 26 include silicon oxide, glass, silicon oxynitride, tantalum oxide, and a material whose main component is a compound obtained by adding fluorine, carbon, or boron to silicon oxide. As long as the material of the low-acoustic-velocity film 26 has a relatively low acoustic velocity, any material may be used.

The configuration of the multilayer body including the high-acoustic-velocity film 25, the low-acoustic-velocity film 26, and the piezoelectric material layer 22 enables energy of elastic waves to be effectively confined on the piezoelectric material layer 22 side.

It is not necessary to include the high-acoustic-velocity film 25. In this case, it is preferable that the support substrate 24 is a high-acoustic-velocity substrate made from a material having a relatively high acoustic velocity as described above. More specifically, examples of the material of the high-acoustic-velocity substrate include piezoelectric materials, such as aluminum nitride, aluminum oxide, silicon carbide, silicon nitride, silicon oxynitride, silicon, DLC film, silicone, sapphire, lithium tantalate, lithium niobate, and crystal, various ceramics, such as alumina, zirconia, cordierite, mullite, steatite, and forsterite, diamond, magnesia, a material whose main component is included in the above materials, and a material whose main component is a mixture of the above materials. Thus, the configuration of the multilayer body including the support substrate 24 defining and functioning as a high-acoustic-velocity substrate, the low-acoustic-velocity film 26, and the piezoelectric material layer 22 enables energy of elastic waves to be effectively confined on the piezoelectric material layer 22 side.

As described above, a combination of the materials of the first and second electrode layers is not limited to Pt and Al. A range of the incline angle θ which may make the fractional bandwidth wider in the case in which the combination of the materials of the first and second electrode layers is not Pt and Al will be described below.

An elastic wave device according to a third modified example of the first preferred embodiment, which is described below, has a configuration the same as or similar to that of the elastic wave device according to the first preferred embodiment except that the second electrode layer is preferably a Cu layer, for example. An elastic wave device according to a fourth modified example of the first preferred embodiment, which is described below, has a configuration the same as or similar to the elastic wave device according to the first preferred embodiment except that the first electrode layer is preferably an Mo layer, for example. The combination of the materials of the first and second electrode layers is preferably, for example, Pt and Cu in the third modified example, and Mo and Al in the fourth modified example.

Figure 14:
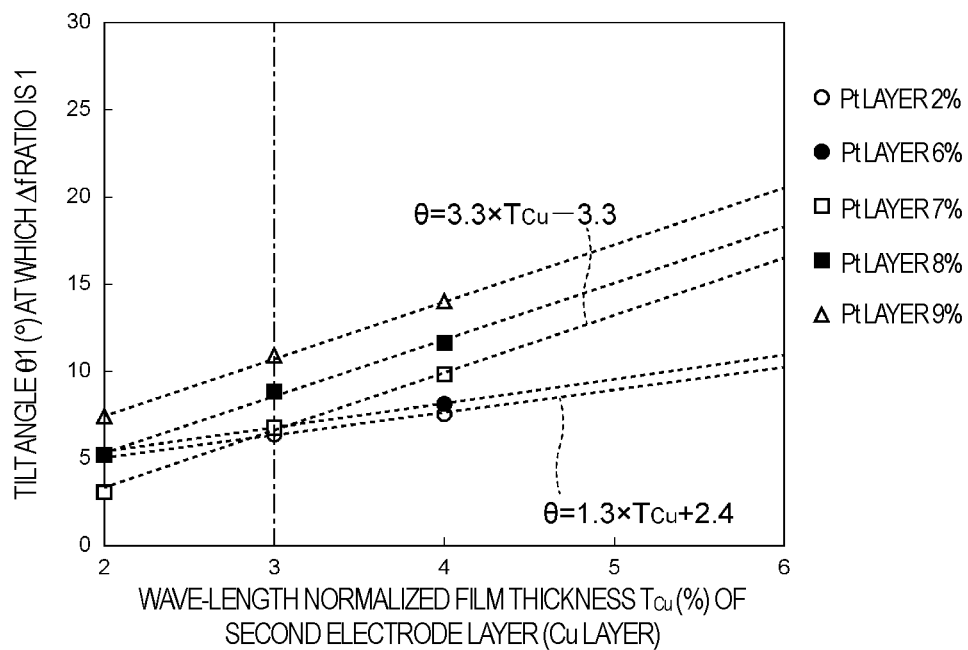
FIG. 14 is a diagram illustrating the relationship between wavelength normalized film thicknesses of first and second electrode layers and incline angle θ1 at which the Δf ratio is equal to about 1, in a third modified example of the first preferred embodiment of the present invention.

FIG. 14 is a diagram illustrating the relationship between wavelength normalized film thicknesses of the first and second electrode layers and incline angle θ1 at which the Δf ratio is equal to about 1, in the third modified example of the first preferred embodiment. In FIG. 14, the white circular plots indicate the result of the case in which the wavelength normalized film thickness of the Pt layer which is the first electrode layer is about 2%, for example. The black circular plots indicate the result of the case in which the wavelength normalized film thickness of the Pt layer is about 6%. The white rectangular plots indicate the result of the case in which the wavelength normalized film thickness of the Pt layer is about 7%, for example. The black rectangular plots indicate the result of the case in which the wavelength normalized film thickness of the Pt layer is about 8%, for example. The triangular plots indicate the result of the case in which the wavelength normalized film thickness of the Pt layer is about 9%.

As illustrated in FIG. 14, the larger the wavelength normalized film thickness of the second electrode layer is, the greater the incline angle θ1, at which the Δf ratio is equal to about 1, is. As described above, in the range of the incline angle θ, 0°<θ≤θ1, the Δf ratio is equal to or greater than about 1, thus achieving a wider fractional bandwidth Δf.

In the third modified example of the first preferred embodiment, the wavelength normalized film thickness of the Pt layer defining the first electrode layer is represented by $T_{Pt}$; the wavelength normalized film thickness of the Cu layer defining the second electrode layer is represented by $T_{Cu}$. As illustrated in FIG. 14, in the case in which the wavelength normalized film thickness $T_{Pt}$ of the first electrode layer is equal to or greater than about 2% and less than about 7% and the wavelength normalized film thickness $T_{Cu}$ of the second electrode layer is less than about 3%, if incline angle θ≤3.3×$T_{Cu}$−3.3, for example, the Δf ratio is able to be made equal to or greater than about 1 with more certainty, thus achieving a wider fractional bandwidth Δf. In the case in which the wavelength normalized film thickness $T_{Pt}$ of the first electrode layer is equal to or greater than about 2% and less than about 7% and the wavelength normalized film thickness $T_{Cu}$ of the second electrode layer is equal to or greater than about 3%, if incline angle θ≤1.3×$T_{Cu}$+2.4, for example, the Δf ratio is able to be made equal to or greater than 1 with more certainty. In contrast, in the case in which the wavelength normalized film thickness of the first electrode layer is equal to or greater than about 7%, if incline angle θ≤3.3×$T_{Cu}$−3.3, for example, the Δf ratio is able to be made equal to or greater than about 1 with more certainty. The conditions enabling the Δf ratio to be made equal to or greater than about 1 with more certainty are collectively described in Table 5 below.

TABLE 5

| Condition of film thickness $T_{Pt}$ (%) of the first electrode layer | Condition of film thickness $T_{Cu}$ (%) of the second electrode layer | Incline angle θ |
| --- | --- | --- |
| 2 ≤ $T_{Pt}$ < 7 | $T_{Cu}$ < 3 | θ ≤ 3.3 × $T_{Cu}$ − 3.3 |
| 2 ≤ $T_{Pt}$ < 7 | $T_{Cu}$ ≥ 3 | θ ≤ 1.3 × $T_{Cu}$ + 2.4 |
| $T_{Pt}$ ≥ 7 | — | θ ≤ 3.3 × $T_{Cu}$ − 3.3 |

A combination of the incline angle θ, the wavelength normalized film thickness $T_{Pt}$, and the wavelength normalized film thickness $T_{Cu}$ is set to a combination set forth in Table 5. In this case, the Δf ratio is able to be made equal to or greater than about 1 with more certainty, thus achieving a wider fractional bandwidth Δf with more certainty.

Figure 15:
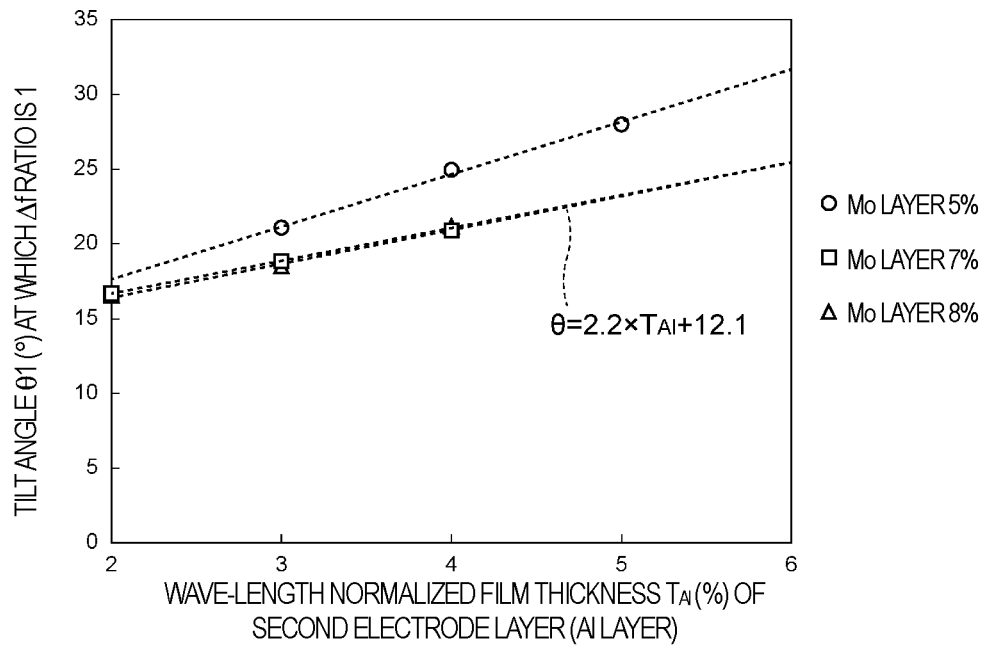
FIG. 15 is a diagram illustrating the relationship between wavelength normalized film thicknesses of first and second electrode layers and incline angle θ1 at which Δf ratio is equal to about 1, in a fourth modified example of the first preferred embodiment of the present invention.

FIG. 15 is a diagram illustrating the relationship between wavelength normalized film thicknesses of the first and second electrode layers and incline angle θ1 at which the Δf ratio is equal to about 1, in the fourth modified example of the first preferred embodiment. In FIG. 15, the circular plots indicate the result of the case in which the wavelength normalized film thickness of the Mo layer defining the first electrode layer is about 5%. The rectangular plots indicate the result of the case in which the wavelength normalized film thickness of the Mo layer is about 7%, for example. The triangular plots indicate the result of the case in which the wavelength normalized film thickness of the Mo layer is about 8%, for example.

As illustrated in FIG. 15, the larger the wavelength normalized film thickness $T_{Al}$ of the Al layer defining the second electrode layer is, the greater the incline angle θ1, at which the Δf ratio is equal to about 1, is. It was discovered that, when the wavelength normalized film thickness of the first electrode layer is equal to or greater than about 7%, for example, the relationship between wavelength normalized film thickness of the second electrode layer and incline angle θ1 hardly changes.

As illustrated in FIG. 15, if incline angle θ≤2.2×$T_{Al}$+12.1, for example, the Δf ratio is able to be made equal to or greater than about 1 with more certainty, thus achieving a wider fractional bandwidth Δf. It is preferable that incline angle θ≤2.2×$T_{Al}$+12.1 and the wavelength normalized film thickness $T_{Al}$ of the second electrode layer is equal to or greater than about 2%, for example. In this case, the Δf ratio is able to be made equal to or greater than about 1 with further greater certainty.

Figure 16:
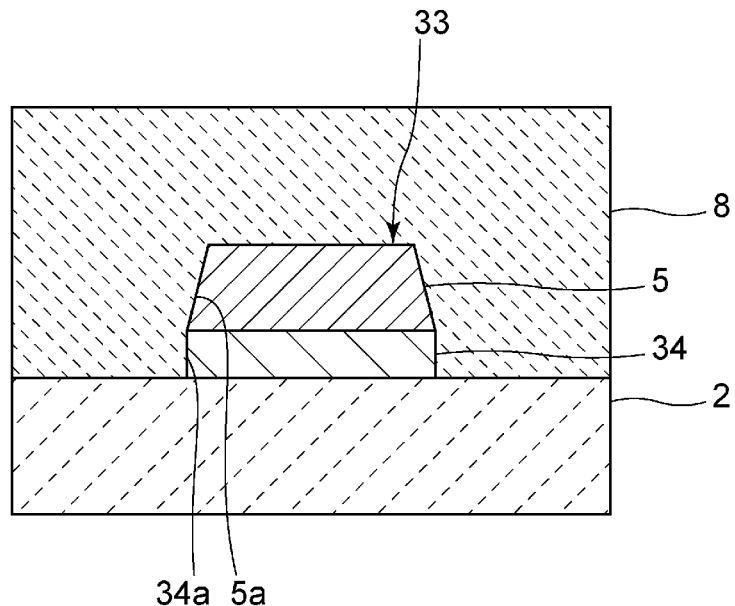
FIG. 16 is an enlarged front sectional view of an electrode finger of an IDT electrode and a portion near the electrode finger, according to a second preferred embodiment of the present invention.

FIG. 16 is an enlarged front sectional view of an electrode finger of an IDT electrode and a portion near the electrode finger, according to a second preferred embodiment of the present invention.

The second preferred embodiment is different from the first preferred embodiment in that a side 34a of a first electrode layer 34 extends parallel or substantially parallel to the thickness direction of an IDT electrode 33. Other than this, the elastic wave device according to the second preferred embodiment has a configuration that same as or similar to that of the elastic wave device 1 according to the first preferred embodiment.

Figure 17:
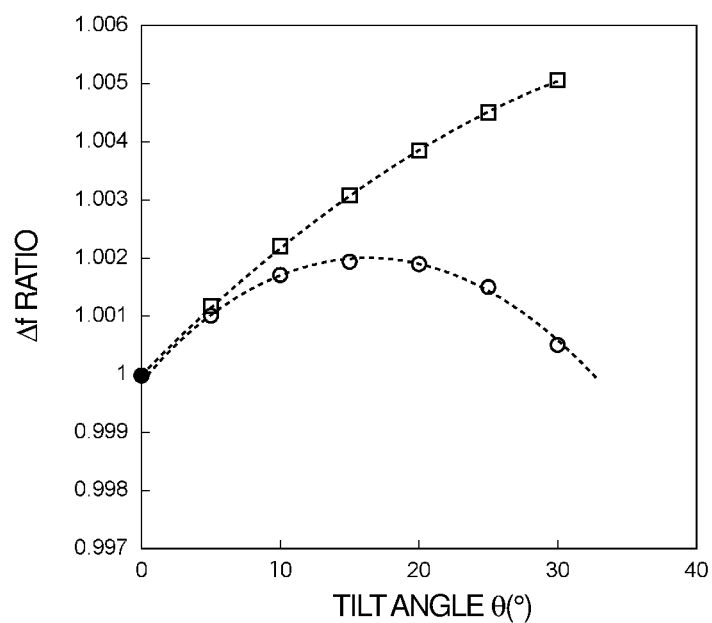
FIG. 17 is a diagram illustrating the relationship between incline angles θ in the first preferred embodiment and the second preferred embodiment of the present invention and Δf ratio.

FIG. 17 is a diagram illustrating the relationship between incline angle θ in the first and second preferred embodiments and Δf ratio. In acquiring the relationship in FIG. 17, the first electrode layer is a Pt layer of a wavelength normalized film thickness of about 2%; the second electrode layer is an Al layer of a wavelength normalized film thickness of about 5%, for example. In FIG. 17, the white circular plots indicate the result of the first preferred embodiment.

The rectangular plots indicate the result of the second preferred embodiment. The black circular plot indicates the result of the first comparative example.

As described above, the first preferred embodiment is able to make the Δf ratio equal to or greater than about 1, thus achieving a wider fractional bandwidth Δf. As illustrated in FIG. 17, it was discovered that the second preferred embodiment achieves an even wider fractional bandwidth Δf. In addition, the second preferred embodiment enables the Δf ratio to be made greater than about 1 also when the incline angle θ is greater than about 32°. Thus, the fractional bandwidth Δf may be made wider in an even wider range of incline angles.

The elastic wave devices according to the preferred embodiments described above may be used, for example, as a duplexer of a radio-frequency front-end circuit. An example of this will be described below.

Figure 18:
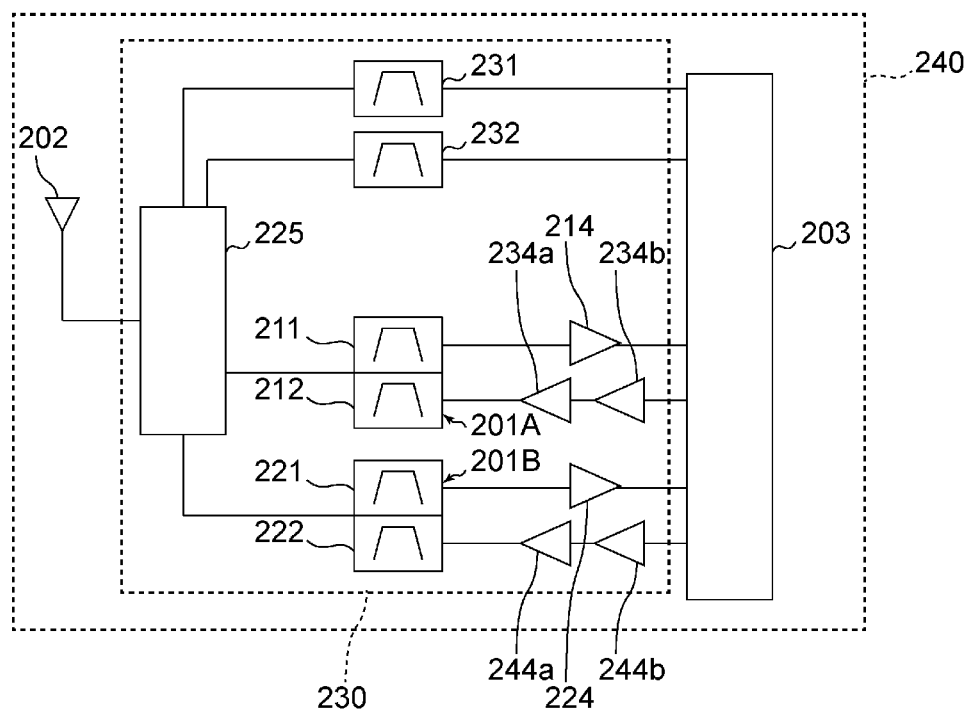
FIG. 18 is a diagram illustrating the configuration of a communication device having a radio-frequency front-end circuit.

FIG. 18 is a diagram illustrating the configuration of a communication device and a radio-frequency front-end circuit. FIG. 18 also illustrates components connected to a radio-frequency front-end circuit 230, for example, an antenna device 202 and a radio-frequency (RF) signal processing circuit (RFIC) 203. The radio-frequency front-end circuit 230 and the RF signal processing circuit 203 are included in a communication device 240. The communication device 240 may include a power supply, a central processing unit (CPU), and a display, for example.

The radio-frequency front-end circuit 230 includes a switch 225, duplexers 201A and 201B, filters 231 and 232, low noise amplifier circuits 214 and 224, and power amplifier circuits 234a, 234b, 244a, and 244b. The radio-frequency front-end circuit 230 and the communication device 240 in FIG. 18 are an exemplary radio-frequency front-end circuit and an exemplary communication device, and are not limited to this configuration.

The duplexer 201A includes filters 211 and 212. The duplexer 201B includes filters 221 and 222. The duplexers 201A and 201B are connected to the antenna device 202 via the switch 225. The elastic wave devices according to preferred embodiments of the present invention and modifications thereof may be used as the duplexers 201A and 201B, or may be used as the filters 211, 212, 221, and 222.

The elastic wave devices according to preferred embodiments of the present invention and modifications thereof may also be applied, for example, to a multiplexer including three or more filters, such as a triplexer including a common antenna terminal for three filters or a hexaplexer including a common antenna terminal for six filters.

That is, the elastic wave devices according to preferred embodiments of the present invention and modifications thereof encompass an elastic wave resonator, a filter, a duplexer, and a multiplexer including three or more filters. The multiplexer is not limited to the configuration in which both of a transmit filter and a receive filter are included, and may have a configuration in which only a transmit filter or only a receive filter is included.

The switch 225 connects the antenna device 202 to a signal path corresponding to a given band, in accordance with a control signal from a controller (not illustrated). The switch 225 includes, for example, a single pole double throw (SPDT) switch. The number of signal paths connected to the antenna device 202 is not limited to one, and may be two or more. That is, the radio-frequency front-end circuit 230 may be compatible with carrier aggregation.

The low noise amplifier circuit 214 defines and functions as a receive amplifier circuit that amplifies a radio-frequency signal (herein, a radio-frequency receive signal) transmitted via the antenna device 202, the switch 225, and the duplexer 201A and that outputs the resulting signal to the RF signal processing circuit 203. The low noise amplifier circuit 224 defines and functions as a receive amplifier circuit that amplifies a radio-frequency signal (herein, a radio-frequency receive signal) transmitted via the antenna device 202, the switch 225, and the duplexer 201B and that outputs the resulting signal to the RF signal processing circuit 203.

The power amplifier circuits 234a and 234b define and function as a transmit amplifier circuits that amplify a radio-frequency signal (herein, a radio-frequency transmit signal) having been output from the RF signal processing circuit 203 and that output the resulting signal to the antenna device 202 via the duplexer 201A and the switch 225. The power amplifier circuits 244a and 244b define and function as a transmit amplifier circuit that amplifies a radio-frequency signal (herein, a radio-frequency transmit signal) having been output from the RF signal processing circuit 203 and that outputs the resulting signal to the antenna device 202 via the duplexer 201B and the switch 225.

The RF signal processing circuit 203 performs signal processing, for example, through down-converting, on a radio-frequency receive signal received through a receive signal path from the antenna device 202, and outputs the receive signal generated through the signal processing. The RF signal processing circuit 203 performs signal processing, for example, through up-converting, on an input transmit signal, and outputs the radio-frequency transmit signal, which is generated through the signal processing, to the power amplifier circuits 234a, 234b, 244a, and 244b. The RF signal processing circuit 203 is preferably, for example, an RFIC. The communication device may include a base band (BB) IC. In this case, the BBIC performs signal processing on a receive signal having been processed by the RFIC. The BBIC performs signal processing on a transmit signal, and outputs the resulting signal to the RFIC. Receive signals having been processed by the BBIC and transmit signals that are to be subjected to signal processing by the BBIC are, for example, image signals and audio signals.

The radio-frequency front-end circuit 230 may include, instead of the duplexers 201A and 201B, duplexers according to a modified example of the duplexers 201A and 201B.

In contrast, the filters 231 and 232 in the communication device 240 are connected between the RF signal processing circuit 203 and the switch 225, not via the low noise amplifier circuits 214 and 224 and the power amplifier circuits 234a, 234b, 244a, and 244b. Similarly to the duplexers 201A and 201B, the filters 231 and 232 are also connected to the antenna device 202 via the switch 225.

The radio-frequency front-end circuit 230 and the communication device 240, which have the configuration described above, include an elastic wave resonator, a filter, a duplexer, and a multiplexer including three or more filters, which are the elastic wave devices according to the preferred embodiments of the present invention and modifications thereof. Thus, the fractional bandwidth may be made wider, and variations in frequency are unlikely to occur.

As described above, the elastic wave devices, the radio-frequency front-end circuits, and the communication devices according to the preferred embodiments of the present invention are described through the preferred embodiments and their modified examples. The present invention encompasses different preferred embodiments implemented by combining any components in the preferred embodiments and the modified examples with one another, modified examples obtained by making various changes, which are conceived by those skilled in the art without departing from the gist of the present invention, on the preferred embodiments described above, and various devices in which the radio-frequency front-end circuit and the communication device according to the preferred embodiments of the present invention are incorporated.

Preferred embodiments of the present invention may be widely used in communication equipment such as cellular phones, as an elastic wave resonator, a filter, a duplexer, a multiplexer applicable to a multi-band system, a front-end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric material layer;
   an IDT electrode disposed on the piezoelectric material layer; and
   a dielectric film that covers at least a portion of the IDT electrode; wherein
   the IDT electrode includes a first electrode layer and a second electrode layer laminated on the first electrode layer;
   each of wavelength normalized film thicknesses of the first and second electrode layers is equal to or greater than about 1.25%, the wavelength normalized film thicknesses of the first and second electrode layers being normalized using a wavelength that corresponds to electrode finger pitch of the IDT electrode;
   the second electrode layer has a density lower than a density of the first electrode layer;
   a side of the second electrode layer is inclined with respect to a thickness direction of the IDT electrode;
   an adhesive layer is disposed between the piezoelectric material layer and the first electrode layer, and/or a diffusion prevention layer is disposed between the first electrode layer and the second electrode layer;
   a side of the adhesive layer is slanted with respect to the thickness direction; and
   a wavelength normalized film thickness of at least one of the adhesive layer and the diffusion prevention layer is less than about 1.25%, the wavelength normalized film thickness of the at least one of the adhesive layer and the diffusion prevention layer being normalized using the wavelength that corresponds to the electrode finger pitch of the IDT electrode.

2. A radio-frequency front-end circuit comprising;
   the elastic wave device according to claim 1; and
   a power amplifier.

3. The radio-frequency front-end circuit according to claim 2, wherein a side of the first electrode layer is inclined with respect to the thickness direction.

4. The radio-frequency front-end circuit according to claim 3, wherein
   the first electrode layer is a Mo layer;
   the second electrode layer is an Al layer;
   a Rayleigh wave is used as a main mode; and
   $\theta \leq 2.2 \times T_{Al} + 12.1$, where $\theta$ is an incline angle (°) of the first and second electrode layers with respect to the thickness direction, and $T_{Al}$ is the wavelength normalized film thickness of the second electrode layer.

5. The radio-frequency front-end circuit according to claim 4, wherein the wavelength normalized film thickness $T_{Al}$ of the second electrode layer is equal to or greater than about 2%.

6. The radio-frequency front-end circuit according to claim 3, wherein
   the second electrode layer is an Al layer;
   a Rayleigh wave is used as a main mode; and
   a combination of Fr, Fsh, $\theta$, and $T_{Al}$ is a combination set forth in Table 1, where Fr is a resonant frequency of the Rayleigh wave Fr, Fsh is a resonant frequency of SH wave, $\theta$ is an incline angle of the first and second electrode layers with respect to the thickness direction, and $T_{Al}$ is the wavelength normalized film thickness of the second electrode layer,

TABLE 1

| Relationship between the resonant frequency Fr and the resonant frequency Fsh | Condition of the film thickness $T_{Al}$ (%) of the second electrode layer | Incline angle $\theta$ (°) |
|---|---|---|
| Fsh > Fr | — | $\theta \leq 3.8 \times T_{Al} + 4.27$ |
| Fsh < Fr | $T_{Al} \leq 4$ | $\theta \leq 3.9 \times T_{Al} - 0.4$ |
| Fsh < Fr | $T_{Al} > 4$ | $\theta \leq 2.8 \times T_{Al} + 4.$ |

7. The radio-frequency front-end circuit according to claim 3, wherein
   the first electrode layer is a Pt layer;
   the second electrode layer is an Al layer;
   a Rayleigh wave is used as a main mode; and
   a combination of $\theta$, $T_{Pt}$, and $T_{Al}$ is a combination set forth in Table 2, where $\theta$ is an incline angle of the first and second electrode layers with respect to the thickness direction, $T_{Pt}$ is the wavelength normalized film thickness of the first electrode layer, and $T_{Al}$ is the wavelength normalized film thickness of the second electrode layer,

TABLE 2

| Condition of the film thickness $T_{Pt}$ (%) of the first electrode layer | Condition of the film thickness $T_{Al}$ (%) of the second electrode layer | Incline angle $\theta$ (°) |
|---|---|---|
| $T_{Pt} \leq 4$ | — | $\theta \leq 3.8 \times T_{Al} + 4.27$ |
| $T_{Pt} \geq 6$ | $T_{Al} \leq 4$ | $\theta \leq 3.9 \times T_{Al} - 0.4$ |
| $T_{Pt} \geq 6$ | $T_{Al} > 4$ | $\theta \leq 2.8 \times T_{Al} + 4.$ |

8. The radio-frequency front-end circuit according to claim 3, wherein
   the first electrode layer is a Pt layer;
   the second electrode layer is a Cu layer;
   a Rayleigh wave is used as a main mode; and
   a combination of $\theta$, $T_{Pt}$, and $T_{Cu}$ is a combination set forth in Table 3, where $\theta$ is an incline angle of the first and second electrode layers with respect to the thickness direction, $T_{Pt}$ is the wavelength normalized film thickness of the first electrode layer, and $T_{Cu}$ is the wavelength normalized film thickness of the second electrode layer,

TABLE 3

| Condition of the film thickness $T_{Pt}$ (%) of the first electrode layer | Condition of the film thickness $T_{Cu}$ (%) of the second electrode layer | Incline angle θ (°) |
|---|---|---|
| $2 \leq T_{Pt} < 7$ | $T_{Cu} < 3$ | $\theta \leq 3.3 \times T_{Cu} - 3.3$ |
| $2 \leq T_{Pt} < 7$ | $T_{Cu} \geq 3$ | $\theta \leq 1.3 \times T_{Cu} + 2.4$ |
| $T_{Pt} \geq 7$ | — | $\theta \leq 3.3 \times T_{Cu} - 3.3$ |

9. A communication device comprising:
the radio-frequency front-end circuit according to claim 2; and
an RF signal processing circuit.

10. The communication device according to claim 9, wherein a side of the first electrode layer is inclined with respect to the thickness direction.

11. The communication device according to claim 9, wherein a side of the first electrode layer extends parallel or substantially parallel to the thickness direction.

12. The radio-frequency front-end circuit according to claim 2, wherein a side of the first electrode layer extends parallel or substantially parallel to the thickness direction.

13. The elastic wave device according to claim 1, wherein a side of the first electrode layer is inclined with respect to the thickness direction.

14. The elastic wave device according to claim 13, wherein
the first electrode layer is a Mo layer;
the second electrode layer is an Al layer;
a Rayleigh wave is used as a main mode; and
$\theta \leq 2.2 \times T_{Al} + 12.1$, where θ is an incline angle (°) of the first and second electrode layers with respect to the thickness direction, and $T_{Al}$ is the wavelength normalized film thickness of the second electrode layer.

15. The elastic wave device according to claim 14, wherein the wavelength normalized film thickness $T_{Al}$ of the second electrode layer is equal to or greater than about 2%.

16. The elastic wave device according to claim 13, wherein
the second electrode layer is an Al layer;
a Rayleigh wave is used as a main mode; and
a combination of Fr, Fsh, θ, and $T_{Al}$ is a combination set forth in Table 1, where Fr is a resonant frequency of the Rayleigh wave Fr, Fsh is a resonant frequency of SH wave, θ is an incline angle of the first and second electrode layers with respect to the thickness direction, and $T_{Al}$ is the wavelength normalized film thickness of the second electrode layer,

TABLE 1

| Relationship between the resonant frequency Fr and the resonant frequency Fsh | Condition of the film thickness $T_{Al}$ (%) of the second electrode layer | Incline angle θ (°) |
|---|---|---|
| Fsh > Fr | — | $\theta \leq 3.8 \times T_{Al} + 4.27$ |
| Fsh < Fr | $T_{Al} \leq 4$ | $\theta \leq 3.9 \times T_{Al} - 0.4$ |
| Fsh < Fr | $T_{Al} > 4$ | $\theta \leq 2.8 \times T_{Al} + 4$ |

17. The elastic wave device according to claim 13, wherein
the first electrode layer is a Pt layer;
the second electrode layer is an Al layer;
a Rayleigh wave is used as a main mode; and
a combination of θ, $T_{Pt}$, and $T_{Al}$ is a combination set forth in Table 2, where θ is an incline angle of the first and second electrode layers with respect to the thickness direction, $T_{Pt}$ is the wavelength normalized film thickness of the first electrode layer, and $T_{Al}$ is the wavelength normalized film thickness of the second electrode layer,

TABLE 2

| Condition of the film thickness $T_{Pt}$ (%) of the first electrode layer | Condition of the film thickness $T_{Al}$ (%) of the second electrode layer | Incline angle θ (°) |
|---|---|---|
| $T_{Pt} \leq 4$ | — | $\theta \leq 3.8 \times T_{Al} + 4.27$ |
| $T_{Pt} \geq 6$ | $T_{Al} \leq 4$ | $\theta \leq 3.9 \times T_{Al} - 0.4$ |
| $T_{Pt} \geq 6$ | $T_{Al} > 4$ | $\theta \leq 2.8 \times T_{Al} + 4$ |

18. The elastic wave device according to claim 13, wherein
the first electrode layer is a Pt layer;
the second electrode layer is a Cu layer;
a Rayleigh wave is used as a main mode; and
a combination of θ, $T_{Pt}$, and $T_{Cu}$ is a combination set forth in Table 3, where θ is an incline angle of the first and second electrode layers with respect to the thickness direction, $T_{Pt}$ is the wavelength normalized film thickness of the first electrode layer, and $T_{Cu}$ is the wavelength normalized film thickness of the second electrode layer,

TABLE 3

| Condition of the film thickness $T_{Pt}$ (%) of the first electrode layer | Condition of the film thickness $T_{Cu}$ (%) of the second electrode layer | Incline angle θ (°) |
|---|---|---|
| $2 \leq T_{Pt} < 7$ | $T_{Cu} < 3$ | $\theta \leq 3.3 \times T_{Cu} - 3.3$ |
| $2 \leq T_{Pt} < 7$ | $T_{Cu} \geq 3$ | $\theta \leq 1.3 \times T_{Cu} + 2.4$ |
| $T_{Pt} \geq 7$ | — | $\theta \leq 3.3 \times T_{Cu} - 3.3$ |

19. The elastic wave device according to claim 1, wherein a side of the first electrode layer extends parallel or substantially parallel to the thickness direction.

20. The elastic wave device according to claim 1, wherein a side of the diffusion prevention layer is inclined with respect to the thickness direction.

* * * * *